United States Patent [19]
Vodopivec et al.

[11] Patent Number: 6,124,722
[45] Date of Patent: Sep. 26, 2000

[54] UNIVERSAL APPARATUS FOR TESTING PRINTED CIRCUIT BOARDS UTILIZING INDEPENDENTLY MOVABLE NEEDLE BOARDS

[75] Inventors: Jozef Vodopivec; Cesare Fumo, both of Gorizia, Italy

[73] Assignee: New System S.R.L., Gorizia, Italy

[21] Appl. No.: 09/091,677

[22] PCT Filed: Aug. 9, 1996

[86] PCT No.: PCT/IT96/00160

§ 371 Date: Jun. 18, 1998

§ 102(e) Date: Jun. 18, 1998

[87] PCT Pub. No.: WO97/23784

PCT Pub. Date: Jul. 3, 1997

[30] Foreign Application Priority Data

Dec. 22, 1995 [IT] Italy .............................. UD95A0251

[51] Int. Cl.[7] .................................................. G01R 31/02
[52] U.S. Cl. ......................... 324/761; 324/755; 324/758
[58] Field of Search ................................... 324/500, 538, 324/754, 758, 761, 755, 72.5, 537, 760; 438/14, 17

[56] References Cited

U.S. PATENT DOCUMENTS

| 4,092,593 | 5/1978 | Wolk ........................................ 324/754 |
| 4,841,241 | 6/1989 | Hiltz et al. ............................... 324/754 |
| 4,975,637 | 12/1990 | Frankeny et al. ...................... 324/760 |
| 5,068,600 | 11/1991 | Hiltz et al. .............................. 324/755 |

*Primary Examiner*—Safet Metjahic
*Assistant Examiner*—Anjan K Deb
*Attorney, Agent, or Firm*—Wenderoth, Lind & Ponack, L.L.P.

[57] ABSTRACT

A machine for the electric testing a printed circuit board. The machine having a plurality of adjacent coplanar needle board pairs, wherein each of the plurality of coplanar needle board pairs has first and second coplanar needle boards to be located on opposite sides of the printed circuit board and a plurality of needles located on each of the coplanar needle boards. Each of the coplanar needle boards being independently movable from each other and the printed circuit board.

17 Claims, 1 Drawing Sheet

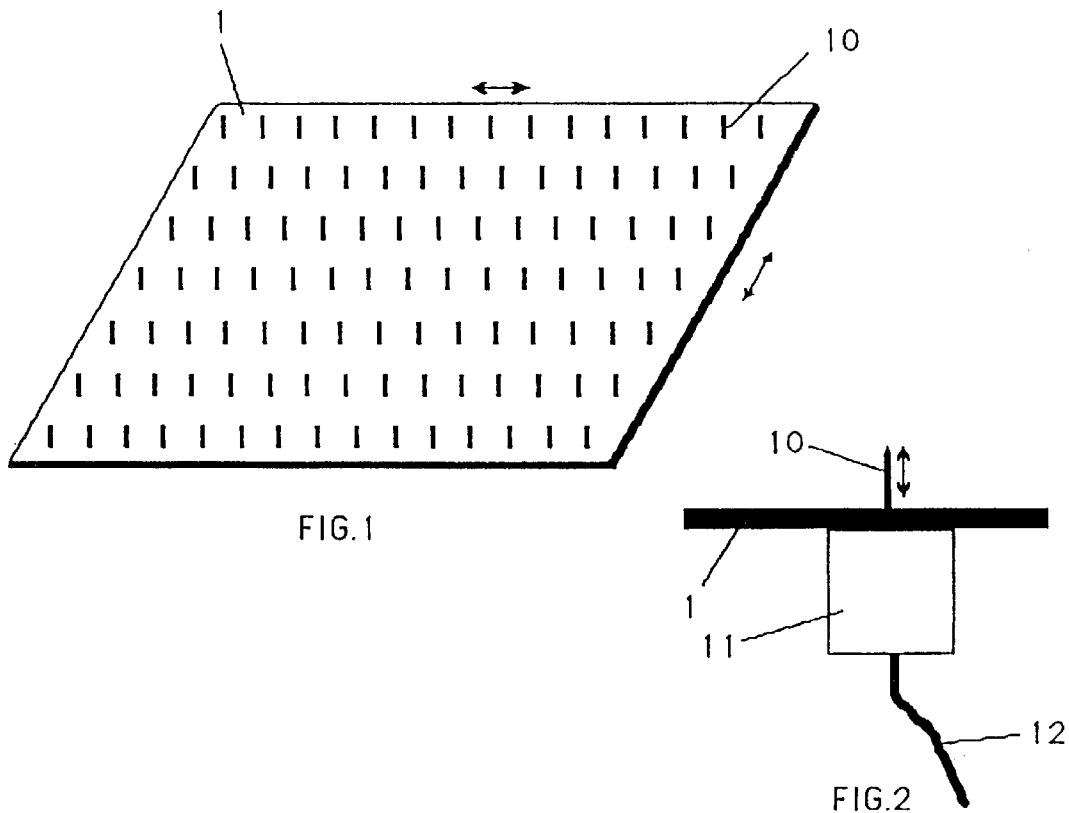
FIG.1
FIG.2
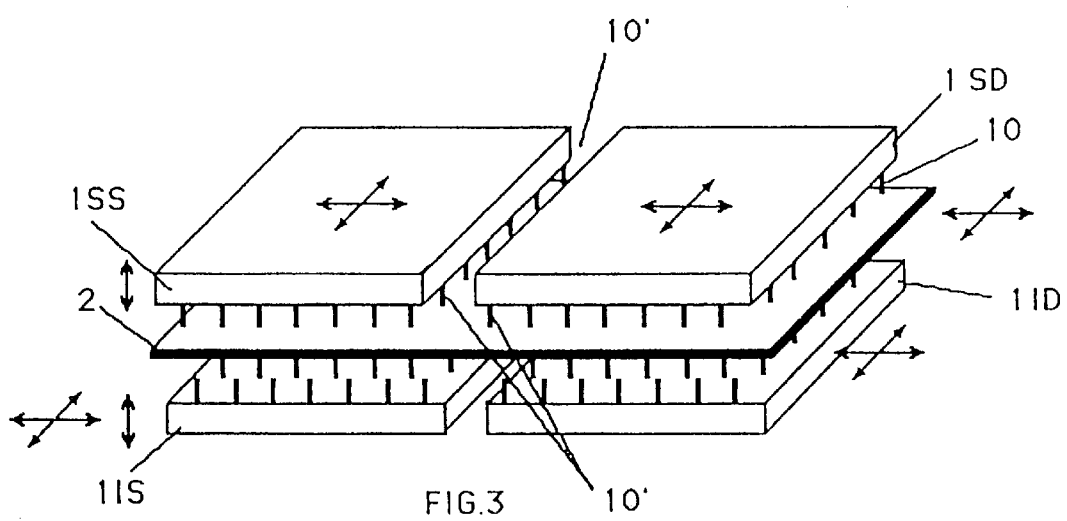
FIG.3

1

UNIVERSAL APPARATUS FOR TESTING PRINTED CIRCUIT BOARDS UTILIZING INDEPENDENTLY MOVABLE NEEDLE BOARDS

TECHNICAL FIELD

This invention has for object a machine for the electrical test of printed circuits with adjustable position of the sound needles.

BACKGROUND ART

In prior art machines for the checking of printed circuits are known.

These machines generally are endowed of a board or bed that bears a plurality of electrically conductive needles, on which is placed the printed circuit card and by suitably activating the electric conductivity among the different needles and by taking the respective measurings it is possible to check whether or not the printed circuit has some defects.

Obviously for such check it is necessary for the needles to contact the printed circuit in the suitable position. As the printed circuits are very different, it is necessary to apply over the base needle board, an adaptation board that comprises the same needles but displaced in a different way according to the printed circuit to be checked.

The drawback of this solution is in the limits of the machine and in the possibility of checking only the printed circuits for which are available corresponding adapters or adapting boards.

Requiring as many adapting boards as are the cards with different printed circuits to be checked.

Furthermore it is known that the surfaces of the circuits are not always coplanar, wherefore it is not always ensured a suitable and vacuum-actuated means included within the compression means and connected to the bottom-side bed-of-nails test probe array for locking down said DUT during a test and for generating said pushrod force for driving the bommo-side bed-of-nails test probe array into electrical contact with said plurality of test points on said second side of said DUT.

DISCLOSURE OF INVENTION

The purpose of the present invention is that of obviating the above-mentioned drawbacks, and in particular of allowing the making of a machine able to check the different printed circuits, that is by means of a detection conductive needles system that can be adapted to any circuit type.

This and other purposes are reached as claimed by means of a machine for the electrical test of printed circuits, of the type comprising a board which bears a plurality of conductive needles that are connectable on their reverse side to means for the analysis of the electrical parameters of one and the other needle, characterised in that:

are used at least two coplanar needle boards one adjacent to the other, and one board is made movable independently from the other, and the respective card to be checked is made movable independently from at least two boards or vice-versa.

In this way there is the immediate advantage of simplifying the whole system by making universal the application of the machine to different printed circuits without need for adapters.

In fact by this it is possible to activate one board needle in electric conduction for an effective contact.

Another solution provides to make movable that is adjustable the respective needles one independently from the other, but this solution is extremely complex and expensive.

The latter solution requires also long checking times because a great number of movable needles cannot be available, wherefore there must practically be a check of each circuit.

Similar features can be observed in U.S. Pat. No. 5,436,567 (WERXLER ET AL.) Jul. 25, 1995 (claim 1 FIG. 1) that discloses a two-sided test probe mechanism, comprising:

a topside, door-mounted array of spring-loaded electrical probes for electrical connection with a first side of a device-under-test (DUT);

a bommo-side bed-of-nails test probe array for electrically contacting a plurality of testpoints on a second side of said DUT opposite to said first side;

compressing means mechanically articulated to the topside, doors mounted array of spring-loaded contacts and fixed to the bottom-side bed-of-nails test probe array for clamping said DUT with;

a lever mechanically connected to the compressing means and articulated to the array of spring-loaded electrical probes and having means for receiving a pushrod force of a first direction perpendicular to a plane including the array of spring-loaded electrical probes and for translating said pushrod force to drive said array of spring-loaded electrical probes independently articulated within the compressing means in a second direction opposite to said first direction and into perpendicular electrical contact with a plurality of test points on said first side of said DUT; any position of the circuit leading end and to activate an opposed needle of the opposed board, which thanks to the mobility, even of said opposed board can reach any determined circuit end point to be tested independently of its position, place and shape.

In this way the universalization of the testing system for any card is ensured.

In fact:

when the printed circuit opposed points to be checked lie one under the first and the other under the second board, and do not coincide with the sound needles, it is sufficient to move both the first and the second board (or move also the card) to position them in exact correspondence with the opposed points to be checked;

when the two printed circuit opposed points to be checked are so close to be covered by just one board, it is sufficient to move the card to be checked with said circuit to an exactly intermediate position between said two boards (or vice-versa to move both said boards), so that one point of the circuit lies under the first plate and the other lies under the second board, and then by moving both of them it will be possible to make perfectly coincide said two points with one respective needle from each of said two boards.

Advantageously the needle boards are set both over and under the card to be checked so that this latter is placed between them.

In this way it is obtained a greater universalization of use.

Advantageously the machine comprises also the characteristic that the detection needles are axially movable.

In this way, out of a plurality of needles in a board it is possible to make interact only some of them, centring with greater ease the wished positions of the printed circuit.

Further advantage derives in that by the axial mobility of the needles it is possible to contact better the respective wished points of the circuit even if the card or the circuit surface is not perfectly coplanar in all its points.

Advantageously the needles are made axially movable by electromagnetic means.

In this way the desired needle is made operate in a safe and simple way.

These and other advantages will appear from the following description of preferred embodiment solutions with the help of the included drawings whose details are not to be considered limitative but only supplied as an example.

FIG. 1 is a perspective schematic view of a detection board (bed);

FIG. 2 is a cross sectional schematic view of an axially movable detection needle.

FIG. 3 is a cross sectional view of the preferred embodiment with two couples of opposed detection boards both independently movable one from the other and having the card to be checked set between them.

The detection boards are indicated by 1 while the needles are indicated by 10.

In particular in the Figures the two upper respectively right and left couples of testing detection boards are indicated by 1SS and 1SD and the lower respectively right and left ones by 1IS and 1ID.

Each board has a plurality of needles axially movable 10 by electromagnet 11.

Each needle is electrically connected to a prior art system for the electric parameters checking 12.

All the boards are as said independently movable one from the other for operative positioning.

The card placed between these is indicated by 2 and it is also movable on the plane.

The system provides a checking by a net list "net-list" with relative positions of single points.

The connections test is carried out from point to point, so that for testing the connections of a net made of "n" points, are necessary "n−1" tests between couples of selected points in order to cover all the connections.

The short circuit test among different nets, is carried out by selecting one point out of each couple of nets.

The maximum number for testing (proving) in this way n nets, can be calculated by the following formula:

$$n*(n-1)/2$$

This number can be decreased by selecting only close nets, namely those that are close one to the other within a predetermined range. The positions to be tested are underdivided in sectors corresponding to the number of needles in the movable board (bed), so that the point to be tested can be reached by the position and by one of the testing needles.

After the points to be tested are reached by at least two boards, it is necessary to check the connection or the insulation.

To diminish the time used for movements, it is possible to optimize the paths of the axes, modifying the frequency of each test.

The machine consists of the frame to which are fixed two couples of opposed boards and independently movable one from the two orthogonal axes.

On the boards are fixed the testing sounds (needles) directly operated in their axial movement by electromagnet.

At first, the printed circuit is placed on a bearing frame that transports it between the two boards.

In this position the card remains fixed or in its turn may be furtherly moved.

The boards are put close to the card and the test begins.

Each board is checked and operated independently, so that the maximum stroke necessary is defined by the distance among the sounds.

In correct position, the electromagnet operates the sound on the surface to be contacted and thus by a couple of simultaneously operated sounds it is possible to check the functionality of the circuit among the two desired points, the respective continuity and eventual short circuits.

The process proceeds by points in repetitive way as wished to.

As said, besides the mobility of one board independently from the other of each couple, it is preferable that also the card bearing is independently movable from one or from the other couple of boards.

In this way a greater universalization of use is obtained.

What is claimed is:

1. An apparatus for measuring electric parameters of a printed circuit board, the apparatus comprising:

a plurality of adjacent coplanar needle boards;

a plurality of conductive needles located on each of said plurality of adjacent coplanar needle boards; and each of said plurality of adjacent coplanar needle boards being independently moveable from each other and the printed circuit board.

2. An apparatus claimed in claim 1, wherein said plurality of adjacent coplanar needle boards comprises two adjacent coplanar needle boards.

3. An apparatus claimed in claim 1, wherein said plurality of conductive needles are each axially moveable.

4. An apparatus claimed in claim 3, wherein said plurality of conductive needles are each made axially moveable with an electromagnetic device.

5. An apparatus for measuring electric parameters of a printed circuit board, the apparatus comprising:

a plurality of adjacent coplanar needle board pairs, wherein each of said plurality of adjacent coplanar needle board pairs comprises first and second coplanar needle boards to be located on opposite sides of the printed circuit board;

a plurality of conductive needles located on each of said coplanar needle boards; and each of said coplanar needle boards being independently moveable from each other and the printed circuit board.

6. An apparatus claimed in claim 5, wherein said plurality of adjacent coplanar needle board pairs comprises two adjacent coplanar needle board pairs.

7. An apparatus claimed in claim 5, wherein each of said plurality of conductive needles is axially moveable.

8. An apparatus claimed in claim 5, wherein each of said plurality of conductive needles is made axially moveable with an electromagnetic device.

9. An apparatus claimed in claim 6, wherein each of said plurality of conductive needles is made axially moveable with an electromagnetic device.

10. An apparatus claimed in claim 9, wherein each of said plurality of conductive needles is made axially moveable with an electromagnetic device.

11. An apparatus claimed in claim 5, wherein only one of said plurality of conductive needles located on each of two of said coplanar needle boards is operable to measure the electric parameters of the printed circuit board at a point in time.

12. An apparatus claimed in claim 5, wherein only one of said plurality of conductive needles is operable on each of said first and second coplanar needle boards of one of said plurality of adjacent coplanar needle board pairs when test points of the printed circuit board are between said one of said plurality of adjacent coplanar needle board pairs, and wherein only one of said plurality of conductive needles is operable on each of said first coplanar needle boards of said plurality of adjacent coplanar needle board pairs when test points of the printed circuit board are between a plurality of said plurality of adjacent coplanar needle board pairs.

13. An apparatus claimed in claim 12, wherein said plurality of adjacent coplanar needle board pairs comprises two adjacent coplanar needle board pairs.

14. An apparatus claimed in claim 12, wherein each of said plurality of conductive needles is axially moveable.

15. An apparatus claimed in claim 12, wherein each of said plurality of conductive needles is made axially moveable with an electromagnetic device.

16. An apparatus claimed in claim 13, wherein each of said plurality of conductive needles is made axially moveable with an electromagnetic device.

17. An apparatus claimed in claim 14, wherein each of said plurality of conductive needles is made axially moveable with an electromagnetic device.

* * * * *